United States Patent
Hopper et al.

(10) Patent No.: US 6,703,710 B1
(45) Date of Patent: Mar. 9, 2004

(54) DUAL DAMASCENE METAL TRACE WITH REDUCED RF IMPEDANCE RESULTING FROM THE SKIN EFFECT

(75) Inventors: Peter J. Hopper, San Jose, CA (US); Peter Johnson, Sunnyvale, CA (US); Kyuwoon Hwang, Palo Alto, CA (US); Michael Mian, Livermore, CA (US); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/219,791

(22) Filed: Aug. 15, 2002

(51) Int. Cl.$^7$ .................. H01L 23/48; H01L 23/28; H01L 29/40
(52) U.S. Cl. .................. 257/758; 257/750; 257/774
(58) Field of Search .................. 257/774, 750, 257/758

(56) References Cited

U.S. PATENT DOCUMENTS

| | | | | |
|---|---|---|---|---|
| 3,573,540 A | * | 4/1971 | Osepchuk | 215/3.6 |
| 4,165,558 A | * | 8/1979 | Armitage, Jr. et al. | 29/590 |
| 5,434,094 A | * | 7/1995 | Kobiki et al. | 148/DIG. 28 |
| 5,952,704 A | * | 9/1999 | Yu et al. | 257/531 |
| 5,998,299 A | * | 12/1999 | Krishnan | 438/694 |
| 6,191,023 B1 | | 2/2001 | Chen | 438/612 |
| 6,326,673 B1 | | 12/2001 | Liou | 257/531 |
| 6,444,517 B1 | * | 9/2002 | Hsu et al. | 438/238 |

* cited by examiner

*Primary Examiner*—Jasmine Clark
(74) *Attorney, Agent, or Firm*—Mark C. Pickering

(57) ABSTRACT

The RF impedance of a metal trace at gigahertz frequencies is reduced by forming the metal trace to have a base region and a number of fingers that extend away from the base region. When formed to have a number of loops, the metal trace forms an inductor with an increased Q.

20 Claims, 4 Drawing Sheets

DUAL DAMASCENE METAL TRACE WITH REDUCED RF IMPEDANCE RESULTING FROM THE SKIN EFFECT

BACKGROUND OF THE INVENTION

1. Field of the Invention

RELATED APPLICATION

The present invention is related to application Ser. No. 10/219,896 for "Metal Trace with Reduced RF Impedance Resulting from the Skin Effect" by Peter J. Hopper et al., application Ser. No. 10/219,235 for "Conductive Trace with Reduced RF Impedance Resulting from the Skin Effect" by Peter J. Hopper et al., and application Ser. No. 10/219,212 for "Etched Metal Trace with Reduced RF Impedance Resulting from the Skin Effect" by Peter J. Hopper et al., all filed on an even date herewith.

2. Description of the Related Art

Metal traces are common integrated circuit elements that are used in a multi-level interconnect structure to connect together various elements of a circuit. In addition, a metal trace can be used to form an integrated circuit inductor by forming the trace to have a number of coils or loops. Inductors are common circuit elements in radio frequency (RF) applications, such as digital cellular telephones.

FIGS. 1A–1D show views that illustrates a prior art integrated circuit inductor 100. FIG. 1A shows a plan view. FIG. 1B shows a cross-sectional view taken along lines 1B—1B of FIG. 1A. FIG. 1C shows a cross-sectional view taken along lines 1C—1C of FIG. 1A. FIG. 1D shows a cross-sectional view taken along lines 1D—1D of FIG. 1A.

As shown in FIGS. 1A–1D, inductor 100 is formed on top of a four metal layer interconnect structure that includes a fourth layer of insulation material I4, and a metal trace 110 that is formed on insulation layer I4 from a fourth metal layer M4. In addition, the metal interconnect structure includes a fifth layer of insulation material I5 that is formed on metal trace 110, and a via 112 that is formed through insulation layer I5 to make an electrical connection with metal trace 110.

As further shown in FIGS. 1A–1D, inductor 100 includes a metal trace 114 that is formed on top of the fifth layer of insulation material I5 from a fifth metal layer M5. Metal trace 114, which has a width W and a depth D, has a first end 120 that is formed over via 112 to make an electrical connection with via 112, and a second end 122. Metal trace 114, which makes one and a half loops in the same plane, is typically formed on top of the metal interconnect structure to avoid inducing currents in the substrate.

One important measure of a metal trace is the RF impedance of the trace, which affects the quality factor or Q of an inductor formed from the metal trace. High Q inductors are desirable in a number of RF circuits, such as resonant circuits. The Q of an inductor is a measure of the ratio of magnetic energy stored in the inductor versus the total energy fed into the inductor, and is given by equation (EQ.) 1 as:

$$Q = \omega L / Z, \quad \text{EQ. 1}$$

where $\omega$ is related to the frequency f of the signal applied to the inductor ($\omega = 2(pi)(f)$), L represents the inductance of the inductor, and Z represents the RF impedance of the inductor. (Impedance is the vector sum of resistance and reactance, and introduces a phase shift.) Thus, as indicated by EQ. 1, the smaller the impedance, the higher the Q of the inductor.

One problem with metal traces is that when gigahertz-frequency signals are placed on the trace, the skin effect causes current to flow primarily at the surface. This effectively increases the RF impedance of the trace which, in turn, lowers the Q of an inductor formed from the trace.

One common approach to reducing the impedance of an integrated circuit inductor is to increase the size of the metal trace. However, in integrated circuit applications, there are practical limitations to the size of the metal trace. As a result, there is a need for a metal trace with reduced RF impedance which, in turn, allows a high Q integrated circuit inductor to be realized from the trace.

SUMMARY OF THE INVENTION

The present invention provides a dual damascene metal trace that has reduced RF impedance at gigahertz frequencies. When the metal trace is formed to have a number of loops, the looping metal trace forms an integrated circuit inductor, while the reduced RF impedance increases the Q of the inductor.

A semiconductor structure in accordance with the present invention includes a layer of insulation material that is formed over a semiconductor substrate. In addition, the semiconductor structure includes a metal trace that is formed in the layer of insulation material. The metal trace has a base region and a plurality of spaced-apart fingers that extend away from the base region. The metal trace can be formed to have a number of loops, and the loops can be formed to lie substantially in the same plane.

The present invention also includes a method of forming a semiconductor structure that includes the step of forming a layer of insulation material over a semiconductor substrate. The method further includes the step of etching the layer of insulation material to form a plurality of first trenches in the layer of insulation material. The trenches have a first bottom surface that is vertically spaced a first distance apart from the top surface.

The method additionally includes the step of etching the layer of insulation material to form a second trench in the layer of insulation material. The second trench has the plurality of first trenches, and the first trenches have a second bottom surface that is vertically spaced a second distance apart from the top surface. The second distance is greater than the first distance.

The method also includes the steps of forming a layer of conductive material on the layer of insulation material to fill up the second trench and the first trenches, and planarizing the layer of conductive material to form a trace.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 1A is a plan view. FIG. 1B is a cross-sectional view taken along lines 1B—1B of FIG. 1A. FIG. 1C is a cross-sectional view taken along lines 1C—1C of FIG. 1A. FIG. 1D is a cross-sectional view taken along lines 1D—1D of FIG. 1A.

FIG. 2A is a plan view, while FIG. 2B is a cross-sectional view taken along line 2B—2B of FIG. 2A.

FIG. 3A is a plan view, while FIG. 3B is a cross-sectional view taken along lines 3B—3B of FIG. 3A. FIG. 3C is a cross-sectional view taken along lines 3C—3C of FIG. 3A. FIG. 3D is a cross-sectional view taken along lines 3D—3D of FIG. 3A.

DETAILED DESCRIPTION OF THE INVENTION

Figure 1A:
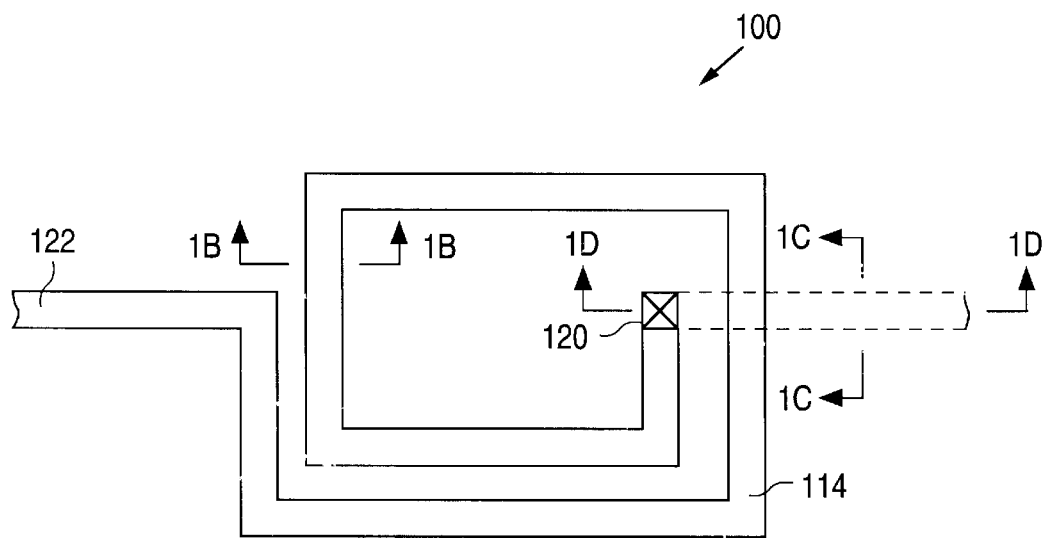
FIGS. 1A–1D are views illustrating a prior art integrated circuit inductor 100.
Figure 1B:
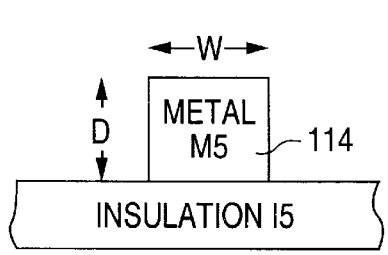
Figure 1C:
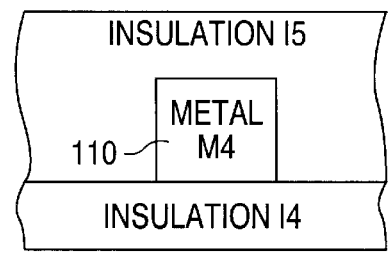
Figure 1D:
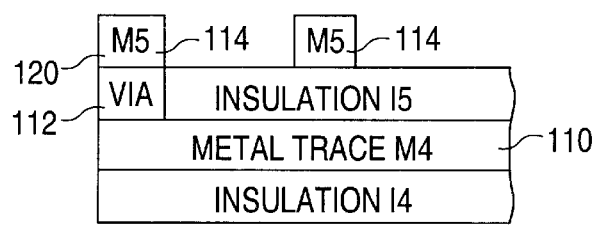
Figure 2A:
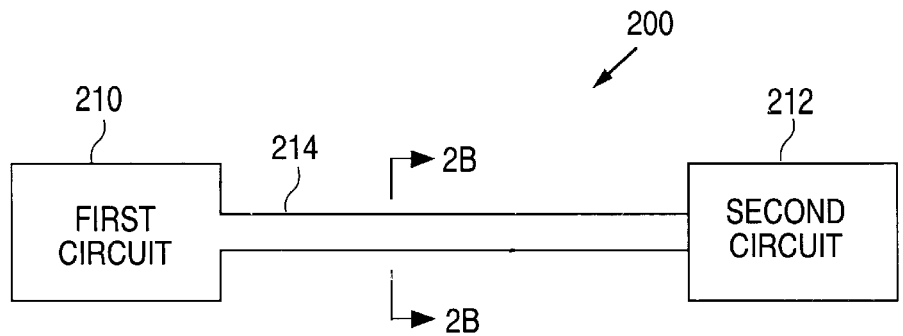
FIGS. 2A–2B are views illustrating an integrated circuit structure 200 in accordance with the present invention.
Figure 2B:
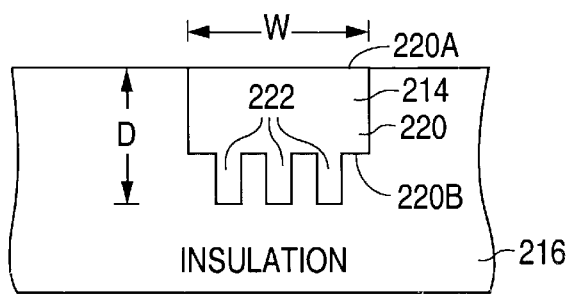

FIGS. 2A–2B show views that illustrate an integrated circuit structure 200 in accordance with the present invention. FIG. 2A shows a plan view, while FIG. 2B shows a cross-sectional view taken along line 2B—2B of FIG. 2A. As described in greater detail below, structure 200 utilizes a metal line that has been formed to have an increased surface area. The increased surface area, in turn, reduces the impedance of the line at gigahertz frequency levels.

As shown in FIGS. 2A–2B, structure 200 includes a first circuit 210 that operates on a gigahertz frequency signal, and a second circuit 212 that operates on a gigahertz frequency signal. In addition, structure 200 includes a metal trace 214 that is electrically connected to circuits 210 and 212. Metal trace 214, which is formed in a layer of insulation material 216, passes gigahertz frequency signals between circuits 210 and 212.

As further shown in FIG. 2B, metal trace 214 has a width W (of approximately four microns) and a depth D (of approximately four microns). Metal trace 214 also has a base region 220 with a top side 220A and a bottom side 220B, and a number of spaced-apart fingers 222 that extend away from bottom side 220A. Fingers 222, in turn, substantially increase the surface area of metal trace 214 when compared to a conventional metal trace that has the same width W and depth D, such as metal trace 114.

In operation, when a signal in the gigahertz frequency range is placed on metal trace 214 by circuit 210 or circuit 212, current flows primarily at the surface of metal trace 214 due to the skin effect. Thus, in accordance with the present invention, since current flows primarily at the surface and fingers 222 substantially increase the surface area of metal trace 214, fingers 222 allow more current to flow. As a result, fingers 222 effectively reduce the RF impedance of metal trace 214.

Thus, the present invention reduces the RF impedance of a metal trace that interconnects two gigahertz frequency devices. (The metal trace connecting together two gigahertz frequency devices can be formed from any one of the layers of metal used to form the metal interconnect structure, such as the first layer of metal, or a combination of metal layers and vias.)

Figure 3A:
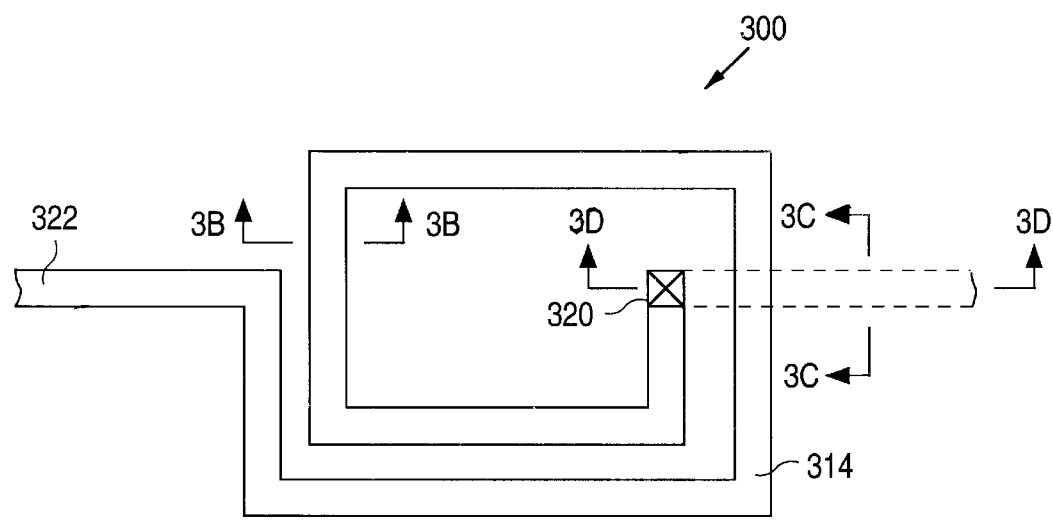
FIGS. 3A–3D are views illustrating an integrated circuit inductor 300 in accordance with the present invention.
Figure 3B:
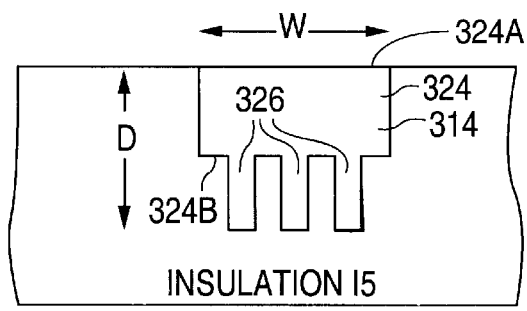
Figure 3C:
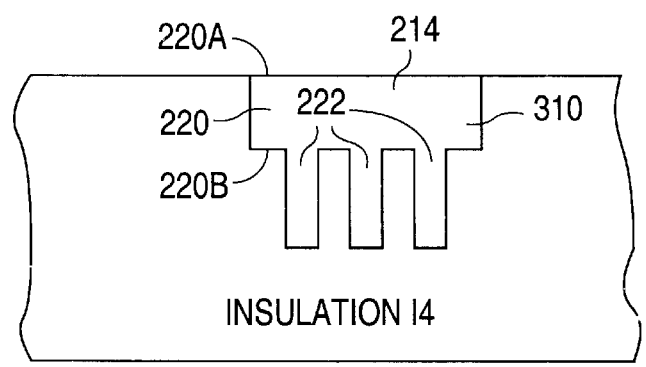
Figure 3D:
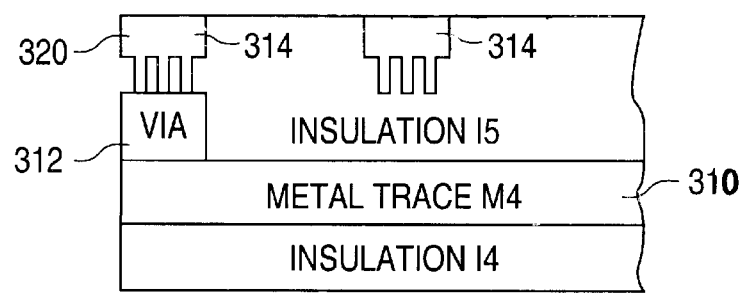

FIGS. 3A–3D are views that illustrate an integrated circuit inductor 300 in accordance with the present invention. FIG. 3A shows a plan view. FIG. 3B shows a cross-sectional view taken along lines 3B—3B of FIG. 3A. FIG. 3C shows a cross-sectional view taken along lines 3C—3C of FIG. 3A. FIG. 3D shows a cross-sectional view taken along lines 3D—3D of FIG. 3A.

As described in greater detail below, inductor 300 is formed from a metal trace that has been formed to have an increased surface area. The increased surface area, in turn, reduces the RF impedance of the metal trace when gigahertz-frequency signals are placed on the trace. As a result, the metal trace of the present invention can be used to form integrated circuit inductors with an increased Q.

In the example shown in FIGS. 3A–3D, like inductor 100, inductor 300 is formed on top of a four metal layer interconnect structure. The interconnect structure includes a fourth layer of insulation material I4, and a metal trace 310 that is formed in insulation layer I4 from a fourth metal layer M4. In addition, the metal interconnect structure includes a fifth layer of insulation material I5 that is formed on insulation layer I4 and metal trace 310, and a via 312 that is formed through insulation layer I5 to make an electrical connection with metal trace 310.

As further shown in FIGS. 3A–3D, inductor 300 includes a metal trace 314 that is formed in the fifth layer of insulation material I5 from a fifth metal layer M5. (Metal trace 314 can be formed from any metal layer, including the first metal layer. The fifth metal layer of the present example is but one possibility. By forming inductor 300 on top of a metal interconnect structure, however, induced substrate currents are minimized).

In addition, metal trace 314 has a first end 320 that is formed over via 312 to make an electrical connection with via 312, and a second end 322. (In this example, second end 322 can be connected to a via connected to a metal-4 trace, or a via connected to a pad or another overlying metal trace.)

Metal trace 314 also has a width W (of approximately four microns) and a depth D (of approximately four microns). Further, metal trace 314 makes one and a half loops in the same plane. (Trace 314 is not limited to one and a half loops, but can be formed with a different number of loops.)

As further shown in FIG. 3B, metal trace 314 has a base region 324 with a top side 324A and a bottom side 324B, and a number of spaced-apart fingers 326 that extend away from bottom side 324B. Fingers 326, in turn, substantially increase the surface area of metal trace 314 when compared to a conventional metal trace that has the same width W and depth D, such as metal trace 114.

In operation, when a signal in the gigahertz frequency range is input to inductor 300, current flows primarily at the surface of metal trace 314 due to the skin effect. Thus, in accordance with the present invention, since current flows primarily at the surface and fingers 326 substantially increase the surface area of metal trace 314, fingers 326 allow more current to flow.

As a result, fingers 326 effectively reduce the RF impedance of metal trace 314, thereby increasing the Q of inductor 300. In addition, as illustrated by FIG. 3C, metal trace 310 can be formed as metal trace 214, thereby providing a low RF impedance pathway from inductor 300 (a first gigahertz frequency device) to another gigahertz frequency device.

Figure 4A:
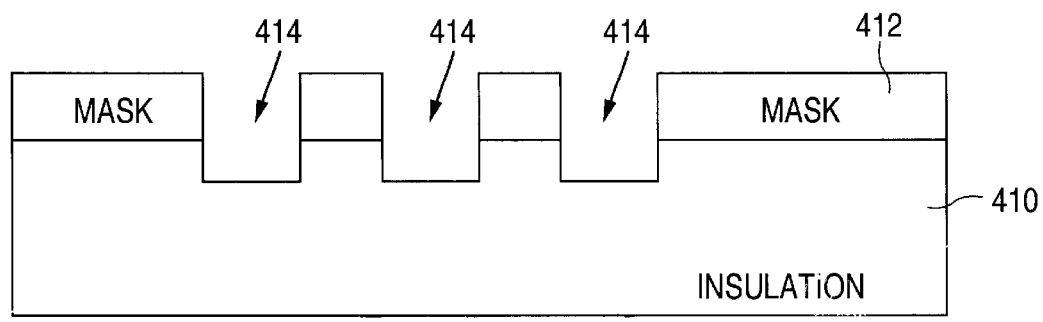
FIGS. 4A–4D are cross-sectional drawings illustrating an example of a method of forming a metal trace in accordance with the present invention.

FIGS. 4A–4D show cross-sectional drawings that illustrate an example of a method of forming a metal trace in accordance with the present invention. As shown in FIG. 4A, the method utilizes a layer of insulation material 410 that has been formed over a semiconductor integrated circuit device. Insulation layer 410, in turn, has a number of contacts or vias that have been formed through insulation layer 410.

In addition, insulation layer 410 can be formed on the surface of the substrate of the device, or on top of a metal trace that is formed from any of the layers of metal that are used to form the metal interconnect structure of the device. For example, when a semiconductor integrated circuit is fabricated with a five layer metal process, insulation layer 410 can be formed on the metal-4 layer.

As further shown in FIG. 4A, the method of the present invention begins by forming a first layer of masking material 412 on insulation layer 410. First layer of masking material 412 is then patterned to expose lines on the surface of insulation layer 410. The exposed regions of insulation layer 410 are then anisotropically etched to form trenches 414. Following this, masking material 412 is removed.

Figure 4B:
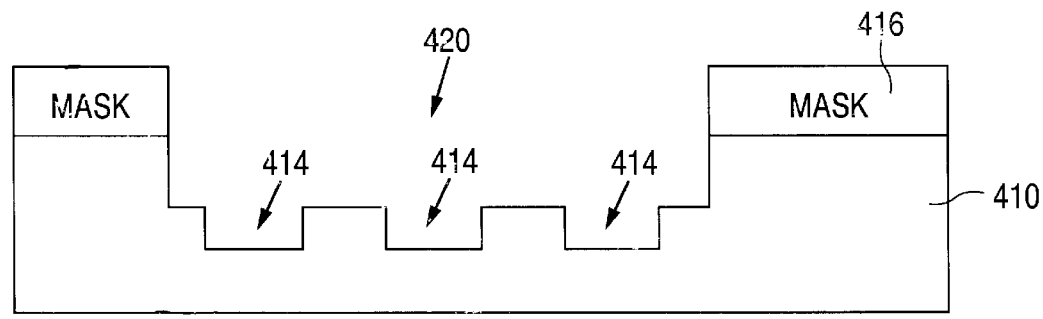

Next, as shown in FIG. 4B, a second layer of masking material 416 is formed on insulation layer 410. Second layer of masking material 416 is then patterned to expose trenches 414. The exposed regions of insulation layer 410 are then anisotropically etched to form a trench 420. As further shown, trench 420 includes trenches 414 that extend away from the bottom side of trench 420. Trenches 414, in turn, define a number of to-be-formed fingers.

Trenches 414 and 420 can be formed to have a number of loops that lie substantially in the same plane to form an inductor. In addition, trenches 414 and 420 can expose a contact or a via formed in insulation material 410. (Trenches 414 and 420 can expose more than one contact or via, or no vias if an overlying metal layer and vias are used to make an electrical connection to the trace that is to be formed in trenches 414 and 420). Once trenches 414 and 420 have been formed, masking material 416 is removed. Masking materials 412 and 416 can be implemented with a soft mask material (photoresist) or a hard mask material (nitride).

Figure 4C:
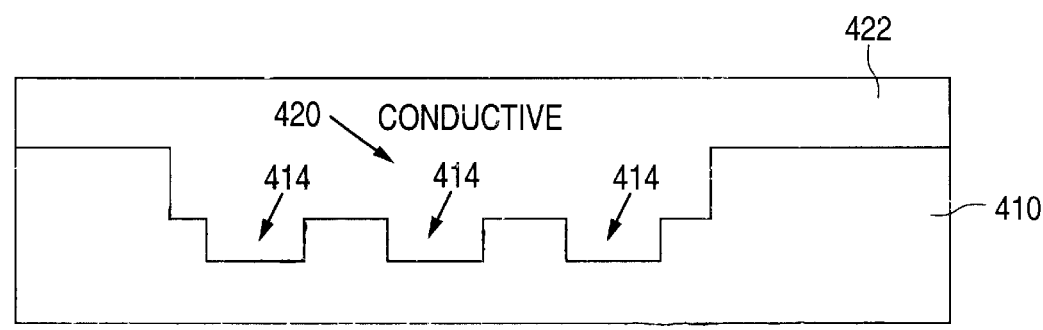

As shown in FIG. 4C, once masking material 416 has been removed, a layer of conductive material 422 is deposited on insulation layer 410 to fill up trenches 414 and 420, and form the damascene structure. Conductive layer 422 can include, for example, a layer of diffusion barrier material and an overlying layer of metal.

The layer of diffusion barrier material can be formed from, for example, a metal nitride such as titanium nitride (TiN) or tungsten nitride (WN). The layer of metal can be formed from, for example, aluminum or copper. When copper is utilized, a seed layer of copper can be deposited on the layer of diffusion barrier material. After this, a layer of copper is electroplated over the seed layer.

Figure 4D:
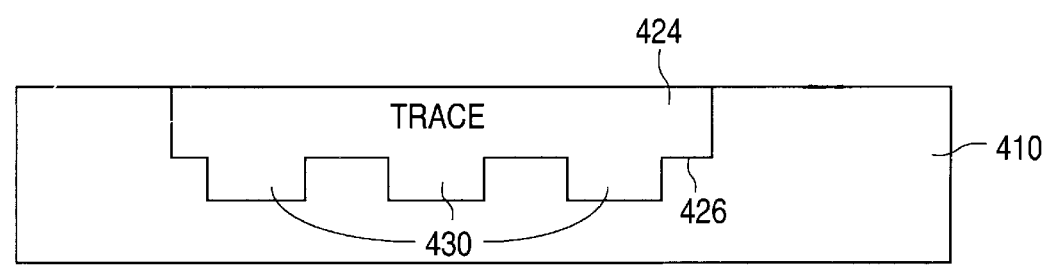

Next, as shown in FIG. 4D, after conductive layer 422 has been formed, conductive layer 422 is planarized using conventional processes, such as chemical-mechanical polishing, until conductive layer 422 has been removed from the top surface of insulation layer 410. The planarizing step forms a dual damascene trace 424 that has a bottom surface 426, and a number of fingers 430 that extend away from bottom surface 426. After the planarizing step has been completed, the method continues with conventional steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor device comprising:
   a layer of insulation material formed over a semiconductor substrate; and
   a metal trace formed in the layer of insulation material, the metal trace having a base region and a plurality of spaced-apart fingers that extend away from the base region, the fingers extending away from a bottom surface of the base region.

2. The semiconductor device of claim 1 wherein the metal trace has a first end electrically connected to a first circuit, and a second end electrically connected to a second circuit, the metal trace passing a gigahertz-frequency signal from the first circuit to the second circuit.

3. The semiconductor device of claim 2 wherein the metal trace lies substantially in a plane horizontal to a surface of the substrate.

4. The semiconductor device of claim 2 wherein the metal trace is connected to a contact.

5. The semiconductor device of claim 2 wherein the metal trace is connected to a via.

6. The semiconductor device of claim 1 wherein the metal trace forms a number of loops.

7. The semiconductor device of claim 6 wherein the loops lie substantially in a same plane.

8. The semiconductor device of claim 6 wherein the metal trace has a first end and a second end.

9. The semiconductor device of claim 8 wherein the second end is connected to a contact.

10. The semiconductor device of claim 8 wherein the second end is connected to a via.

11. The semiconductor device of claim 10 wherein the via lies under the metal trace.

12. The semiconductor device of claim 6 wherein the fingers extend away from a bottom surface of the base region.

13. A semiconductor device comprising:
    a layer of insulation material formed over a semiconductor substrate; and
    metal trace formed in the layer of insulation material, the metal trace having a width, a length that is substantially greater than the width, and a plurality of spaced-apart fingers that extend away from a bottom side of the metal trace and run from a first end of the metal trace to a second end of the metal trace along the length, a top surface of the metal trace and a top surface of the insulation material lying in a same horizontal plane.

14. The semiconductor device of claim 13 wherein the metal trace forms a number of loops.

15. The semiconductor device of claim 14 wherein the loops lie substantially in a same plane.

16. The semiconductor device of claim 13 wherein the second end is connected to a via.

17. The semiconductor device of claim 16 and further comprising a trace segment that makes an electrical connection with the via, and lies lower than the metal trace.

18. The semiconductor device of claim 17 wherein the metal trace segment has a plurality of fingers that extent away from a bottom surface of the metal trace segment.

19. The semiconductor device of claim 17 wherein the metal trace segment has a width, a length that is substanially greater than the width, and a plurality of fingers that extend away from a bottom surface of the metal trace segment and run from end to a second end of the metal trace segment along the length.

20. The semiconductor device of claim 13, wherein the fingers run continuously from the first end to the second end.

* * * * *

UNITED STATES PATENT AND TRADEMARK OFFICE
CERTIFICATE OF CORRECTION

PATENT NO. : 6,703,710 B1
DATED : March 9, 2004
INVENTOR(S) : Hopper et al.

Page 1 of 1

It is certified that error appears in the above-identified patent and that said Letters Patent is hereby corrected as shown below:

Column 1,
Lines 6-9, delete "BACKGROUND OF THE INVENTION"
    1.    Field of Invention".
Line 20, before "2. Description of the Related Art" insert
    -- "BACKGROUND OF THE INVENTION
    1.    Field of the Invention --.

Column 6,
Line 33, before "metal" insert -- a --.
Line 48, after "a" insert -- metal --.
Line 51, delete "extent" and replace with -- extend --.
Line 54, delete "substanially" and replace with -- substantially --.
Line 57, after "from" insert -- a first --.

Signed and Sealed this

Twelfth Day of October, 2004

JON W. DUDAS
*Director of the United States Patent and Trademark Office*